United States Patent
Gybin et al.

(10) Patent No.: US 7,074,358 B2
(45) Date of Patent: Jul. 11, 2006

(54) POLYMER CASTING METHOD AND APPARATUS

(76) Inventors: Alexander Sergeievich Gybin, 422 Isanti St., Duluth, MN (US) 55803; Toshifumi Komatsu, 3608 Juten Dr., Duluth, MN (US) 55803

(*) Notice: Subject to any disclaimer, the term of this patent is extended or adjusted under 35 U.S.C. 154(b) by 323 days.

(21) Appl. No.: 10/017,466

(22) Filed: Dec. 13, 2001

(65) Prior Publication Data
US 2003/0111771 A1   Jun. 19, 2003

(51) Int. Cl.
*B29C 35/08* (2006.01)

(52) U.S. Cl. .......... 264/400; 264/482; 264/494; 264/219

(58) Field of Classification Search ........ 264/400, 264/482, 494, 219
See application file for complete search history.

(56) References Cited

U.S. PATENT DOCUMENTS

| | | | |
|---|---|---|---|
| 4,144,300 A * | 3/1979 | Breeden | 264/106 |
| 4,456,680 A | 6/1984 | Nakamura et al. | |
| 4,587,186 A | 5/1986 | Nakamura et al. | |
| 4,764,449 A | 8/1988 | VanIseghem | |
| 4,858,394 A | 8/1989 | Lalumiere et al. | |
| 5,093,160 A | 3/1992 | Johnson et al. | |
| 5,260,173 A | 11/1993 | Birkholm | |
| 5,334,485 A | 8/1994 | Van Iseghem et al. | 430/287 |
| 5,346,577 A | 9/1994 | Johnson et al. | |
| 5,366,584 A | 11/1994 | Zukowski et al. | |
| 5,370,762 A | 12/1994 | Zukowski et al. | |
| 5,415,971 A | 5/1995 | Couture et al. | |
| 5,506,089 A | 4/1996 | Gybin et al. | |
| 5,593,811 A * | 1/1997 | Loerzer et al. | 430/258 |
| 5,645,975 A | 7/1997 | Gybin et al. | |
| 5,654,032 A | 8/1997 | Gybin et al. | |
| 5,952,397 A | 9/1999 | Fujiki et al. | |
| 5,989,689 A | 11/1999 | Komatsu | |
| 5,990,190 A | 11/1999 | Nakamura et al. | |
| 6,020,436 A | 2/2000 | Gybin et al. | |
| 6,037,106 A | 3/2000 | Komatsu | |
| 6,140,006 A | 10/2000 | Komatsu et al. | |
| 6,235,449 B1 | 5/2001 | Souders et al. | |
| 6,248,498 B1 | 6/2001 | Gybin | |
| 6,294,313 B1 | 9/2001 | Kobayashi et al. | |
| 6,579,664 B1 * | 6/2003 | Hu et al. | 430/284.1 |

FOREIGN PATENT DOCUMENTS

EP   0 506 959 B1   9/2000

OTHER PUBLICATIONS

"Flexographic Plates", http://www.wmich.edu, 2 pgs. (Printed Dec. 7, 2001).
Monteleone, D., "Environmental Management of Photopolymer Flexographic Printing Plates—Fact Sheet", http://www.pneac.org, 5 pgs. (© 2000 PNEAC).

* cited by examiner

*Primary Examiner*—Suzanne E. McDowell

(57) ABSTRACT

Methods and materials used to make detailed cast objects are disclosed. The cast objects are formed in mold created from a photosensitive laminate. The mold is formed by selectively removing portions of the photosensitive laminate. The invention is particularly well suited to make thin molded articles, but can also be used to make thicker molded articles by using multiple photosensitive layers or laminates.

17 Claims, 3 Drawing Sheets

POLYMER CASTING METHOD AND APPARATUS

FIELD OF THE INVENTION

The present invention is directed to methods and materials for forming cast articles. More specifically, the invention is directed to imageable photosensitive compositions and films for use in forming cast articles, and to articles made using the methods, compositions, and films.

BACKGROUND OF THE INVENTION

Numerous commercial and industrial applications require formation of high quality, high resolution, molded or cast objects. In many of these applications, such as in producing product prototypes, it is desirable to rapidly form precise molded objects. For example, automotive manufacturers normally make mock-ups of the interiors of prototype vehicles before committing to mass-producing them. These prototype interiors will often be very complete, even including surfaces having simulated leather texture. Automotive manufacturers would benefit from a molding method that allows rapid formulation of molds for making the simulated leather surfaces.

Similarly, certain applications require customized low-volume production of molded or cast articles. For example, a business may wish to place nametags that have a three dimensional logo or design on each employee's door. Such nametags could easily be produced by a method that allowed cast nametags to be inexpensively made without the time and expense of making complex machined molds.

Therefore, a need exists for improved methods and materials for forming high quality, inexpensive, and optionally low-volume molds and molded objects.

SUMMARY OF THE INVENTION

The present invention is directed to methods and materials used to make cast or molded objects. The objects are usually formed in a recess (or depression) in a photosensitive laminate. The recess is formed by selectively removing portions of a photosensitive laminate. The invention is particularly well suited to making thin molded articles, but can also be used to make thicker molded articles by using multiple layers of photosensitive laminates or by using thicker layers of laminate. Alternatively, multiple layers of the photosensitive material can be built up by repeatedly exposing and developing layers of the photosensitive material to form thick, relatively complex molds.

In certain embodiments the invention includes a method for forming a cast article from a photosensitive film. Various different types of photosensitive film can be used. The film generally includes more than one layer, these layers are normally laminated together, and at least one layer contains a photosensitive material. In order to form a mold, the photosensitive material is selectively exposed to light, and then a portion of the layer containing the photosensitive material is removed. The removed portion corresponds to either the exposed or unexposed portion of the photosensitive material and results in formation of a relief surface in the film. After this relief surface is formed, a casting material is applied to the relief surface to form a cast article. Generally the casting material is a liquid that can be hardened to form a moldable object. Suitable casting materials include, without limitation, plaster, polymer resins, uv-curable materials, thermoset materials, and low melting point metal alloys.

In some implementations the mold is formed by selectively exposing only those portions of the laminate film that will form the actual mold, while the unexposed portions are removable (such as in a water bath). This selective exposure and removal creates the relief or depression to receive the casting material. In other implementations the mold is formed by selectively exposing portions of the laminate film that are to be removed, while the unexposed portions are left behind to form the actual mold.

The photosensitive material can comprise a photopolymer that responds to radiation. For example, without limiting the invention, the photosensitive material can include a water-soluble, photosensitive vinyl polymer. Suitable photosensitive vinyl polymers include polyvinyl alcohol polymer. Other materials may also be present in the photosensitive material to improve the performance of the photosensitive laminate, including binder resins and plasticizers. In certain implementations the photosensitive material comprises less than 50 weight percent of a photopolymer, about 30 to 90 weight percent of a binder resin, and about 0 to 40 weight percent of compatible plasticizers. For example, the photosensitive material can contain about 15 to 50 weight percent of a photopolymer, about 50 to 80 weight percent of a binder resin, and about 0 to 15 weight percent of compatible plasticizers.

The photosensitive film also generally includes a support layer. The support layer provides a substrate for the photosensitive material. In some implementations, the support layer forms the bottom of the mold after the photosensitive material has been selectively removed. The sides of such molds are normally formed by the photosensitive material that remains after exposure and developing.

The photosensitive film should be thick enough to allow formation of suitable cast articles. In most implementations, the total film thickness is at least 1 mil, and even more typically at least 2 mils. Normally, the layer of the film containing the photosensitive material is at least 0.25 mils thick, more typically at least 1 mil thick, and even more typically at least 3 mils thick. The photosensitive laminate film is typically flexible. This flexibility allows for formation of multi-dimensional molds by conforming the film to another substrate. Flexibility also allows the film to be easily peeled from a cast object.

In some embodiments of the invention the film includes materials that aid in the removal of a cast object from the mold. In some such implementations the photosensitive material is substantially non-tacky or contains release agents. Alternatively, after the mold has been formed a release agent can be applied to exposed mold surfaces. Various release agent materials are suitable for this purpose.

The invention is particularly well suited to formation of flexographic printing plates, in particular for forming molds for creation of flexographic printing plates. As used herein, flexographic printing plates refers generally to printing plates. In particular, in most implementations the term "flexographic" refers to flexible printing plates, and typically to printing plates commonly known as "flexographic" in the printing industry. Flexographic printing plates have traditionally been formed by exposing photopolymer material to UV light in order to partially cure the photopolymer, washing out unexposed polymer with a solvent (which typically swells the exposed polymer composition), and then drying to remove the solvent and swelling, followed by additional exposure to completely cure the entire polymer composition (in particular the "shoulders" of the raised areas and the "floor" surrounding the raised areas). Using the present invention, a mold for the flexographic composition is quickly and efficiently formed, typically without using a solvent other than water. This mold is then used to hold the photopolymer that forms the flexographic printing plate. The photopolymer resin is poured directly into the mold and then can be exposed, for example, to significant amount of UV radiation to completely cure the plate, which is then removed from the mold.

The invention will now be described in greater detail.

FIGURES

The invention will be more fully explained with reference to the following drawings, in which.

Figure 1:
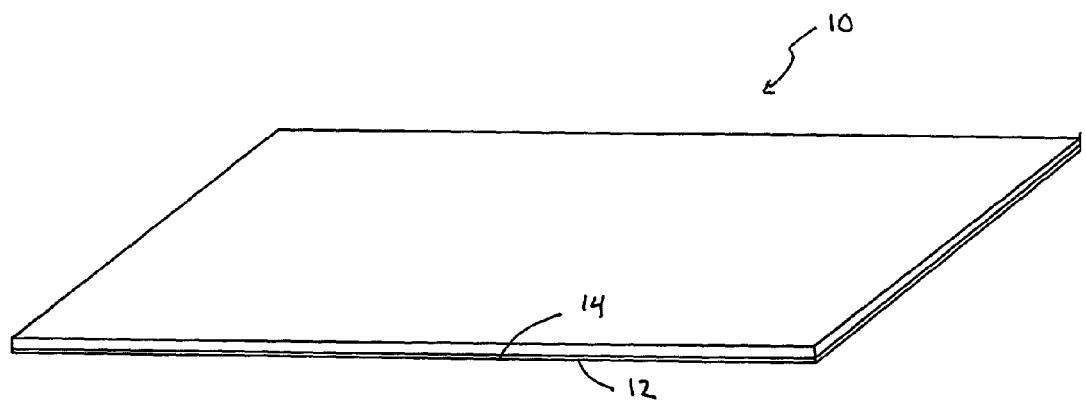
FIG. 1 is a perspective view of a laminate constructed and arranged in accordance with the invention.

While principles of the invention are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the disclosure.

DETAILED DESCRIPTION OF THE INVENTION

The present invention is directed to methods and materials used to make cast objects. The cast objects are formed in a mold that is produced from a photosensitive material. The photosensitive material is normally provided in the form of a photosensitive film that allows rapid, inexpensive production of a detailed mold. The mold can be used for making customized molded objects or for making low-volume molded components. The invention is particularly well suited to manufacture of thin molded articles, but can also be used to make thicker molded articles by using multiple photosensitive laminates or by arranging the multiple photosensitive laminates to create a larger mold.

The photosensitive film is typically a laminate, and generally includes at least one layer containing a photosensitive material. During processing to make a mold, this photosensitive material is selectively exposed to light, and then a portion of it is removed. The removed portion corresponds to either the exposed or unexposed portion of the photosensitive material. Removal of this portion of the photosensitive material forms a relief surface in the laminate film. After this relief surface is formed a casting material is applied to the relief surface to form a cast article. Suitable casting materials include, without limitation, plaster, resins, and low melting temperature metal alloys.

Various details of the components and methods of the invention will now be described in greater detail.

Photosensitive Composition

The photosensitive laminate of the invention includes at least one photosensitive layer. The photosensitive layer contains a positive-working or a negative-working photosensitive material that interacts with light. In the case of negative-working photosensitive materials, the light modifies the photosensitive material such that the exposed portion is solidified or hardened sufficiently to form a mold. The solidification or hardening can, for example, be attributable to crosslinking or polymerization of the photosensitive material. Generally light transforms negative-working photosensitive material from a soluble state to a substantially less soluble state. For example, substances in the photosensitive layer can crosslink when exposed to a sufficient quantity of actinic radiation. Such crosslinking reactions render the exposed photosensitive material less soluble or substantially less soluble to the action of a solvent, such as water, allowing removal of non-exposed material and creation of a mold.

A wide range of different photosensitive materials can be used with the present invention. For example, in one implementation, the photosensitive material of the present invention can be obtained through condensation of a variety of rhodanine compounds. Suitable methods and materials are disclosed in U.S. Pat. No. 6,020,093 to Shibuya et al., incorporated in its entirety herein by reference. Additional compositions include those disclosed in, for example, U.S. Pat. No. 6,248,498 entitled "Photosensitive resin composition"; U.S. Pat. No. 6,140,006 entitled "Integral membrane layer formed from a photosensitive layer in an imageable photoresist laminate"; U.S. Pat. No. 6,020,436 entitled "Photosensitive resin composition"; and U.S. Pat. No. 5,506,089 entitled "Photosensitive resin composition", each of which is incorporated herein in its entirety.

The photosensitive material can be either a "negative-working" or a "positive-working" photosensitive composition. Negative-working compositions are generally water soluble, but respond to light by cross-linking to become less soluble or insoluble. Positive-working compositions are generally insoluble prior to being exposed to light, but become soluble upon exposure to light of a sufficient intensity, duration, and wavelength.

When a negative-working photopolymer is used, the mold is formed by selectively exposing those portions of the laminate film that will form the actual mold, while the unexposed portions are removable (such as in a water bath) to create a relief or depression to receive the casting material. When a positive-working photopolymer is used, the exposed portions of the laminate are dissolvable and removed to form the relief or depression into which the casting material is placed.

The photosensitive material can comprise a photopolymer, such as a water-soluble, photosensitive vinyl polymer. Suitable photosensitive vinyl polymers include polyvinyl alcohol polymer. The photosensitive layer can comprise less than 75% by weight of a water soluble, photosensitive vinyl polymer having pendent hydroxyl groups and being capable of photo-generated insolubility, and less than 75 weight percent of a polymeric film-forming binder. The photosensitive vinyl polymer can be present in very low concentrations in some implementations, potentially as low as 1 percent, as long as the concentration of vinyl polymer is sufficient to form a mold.

The photosensitive compositions can optionally contain other functional materials, including surfactants, defoamers, dyes, antioxidants and other additives that aid in the formation of a photosensitive layer without holes, thin spots or other variations. The photosensitive layer can also contain a film forming polymeric binder, and optionally a plasticizer. The filler, antioxidant, and dye or pigment optionally used in the invention should not interfere significantly with the imaging and hardening of the photosensitive composition. The photosensitive compositions of the invention can further include a film forming polymeric binding agent. During photo-crosslinking of the composition, the binding agent is entrapped in a mesh formed by the crosslinking polymeric materials.

Typically, polymeric binding agents comprise relatively water insoluble polymers that can be formed into lattices or stable suspensions of small particles in water or aqueous media. Suitable binding agents include, without limitation, carboxymethyl cellulose, partially hydrolyzed polyvinyl alcohols, water insoluble homopolymers and copolymers made of such materials as styrene, methylmethacrylate, vinyl acetate, acrylic materials, vinyl butyrl, vinyl pyrrolidone, ethylene, propylene, alkylene oxide monomers and other monomers.

Preferred polymeric binding agents comprise polyvinyl acetates for reasons of compatibility with polyvinyl alcohol polymers, economy, and stability of their suspensions in aqueous media. A representative, non-limiting list of such materials includes polyvinyl acetate, a polyethylene-vinyl acetate copolymer, vinyl acrylic homopolymer, vinyl acrylic copolymer, ethyl cellulose, and cellulose acetate. The binding resin should be removable in the developer (such as water), and preferably, the binding resin is water dispersible.

The photosensitive compositions can contain plasticizer components that help in providing resiliency and adhesion to the layers, and which permit the layers to resist flaking and delamination during use. Any plasticizer which does not interfere significantly with the photoimaging and photohardening of the polymeric material may be used in the photosensitive, adhesive layer or film. A representative, non-limiting list of such materials includes phthalates, benzoates, phosphates, adipates, sebacate esters, and polyols such as ethylene glycol and its derivatives. Typically the photosensitive layer contains about 0.1 to about 75 weight percent of the photosensitive composition, preferably about 5 to 35 weight percent of the photosensitive compositions.

In certain implementations the photosensitive material comprises less than 50 weight percent of a photopolymer, about 30 to 90 weight percent of a binder resin, and about 0 to 40 weight percent of compatible plasticizers. For example, the photosensitive material can contain about 15 to 50 weight percent of a photopolymer having pendant, photo cross-linkable groups, about 50 to 80 weight percent of a binder resin, and about 0 to 15 weight percent of compatible plasticizers.

Film Materials and Construction

The photosensitive film is generally a laminate that includes a support layer. The support layer provides a substrate for the photosensitive material. In some implementations, the support layer forms the bottom of the mold after the photosensitive material has been selectively removed. The sides of such molds can be formed by the photosensitive material that remains after exposure and developing. Additional layers can also be used.

The laminate should be thick enough to allow formation of suitable low-cost articles. In most implementations, the total laminate thickness is at least 1 mil thick, and even more typically at least 3 mils thick. Normally, the layer of the laminate containing the photosensitive material is at least 0.25 mil thick, more typically at least 1 mil thick, and even more typically at least 2 mils thick.

The photosensitive laminate film is typically flexible. This flexibility allows for formation of multi-dimensional molds by conforming the laminate film to another substrate. In some implementations of the invention, the flexibility can also allow the laminate to be easily peeled from a cast object.

The photosensitive materials of the invention can be made by coating the aqueous materials on a support layer or film. In one mode for manufacturing the invention, a support film is coated with a photosensitive layer. The photosensitive layer typically has a dry thickness of between about 0.25 mils and 400 mils, preferably about 1 mil to 100 mils. However, in some implementations the thickness can be greater or less than these dimensions. Such coating operations can be performed conventionally using the aqueous materials discussed above.

The film or carrier layer of the invention comprises a web, film or other relatively thin material that can be coated with the photosensitive composition of the invention to form at least one photosensitive layer. This film or carrier layer should typically be mechanically strong enough to permit rapid manufacture of the laminate, but should also be processable by exposure processing and imaging environments of the invention.

Suitable sheet-like film or support layers can comprise transparent films. These films are typically about 0.05 to 0.3 mm (2 to 10 mils) thick and can be made from a variety of natural or synthetic materials, including treated cellulose, paper, polyolefin resins, polyester resins, and polyvinylchloride resins. Suitable sheet-like materials for use in this invention are typically thin, less than 0.20 mm, such as polyethylene terephalate polyester (Mylar®) sheets less than 0.10 mm thick.

In addition to the support layer, various other layers may be incorporated into the photosensitive film. For example, a sublayer may be included to secure the photosensitive layer to the support layer, such as during development. Suitable sublayers can be made from, for example, a natural or synthetic rubber composition. Also, a membrane layer can be positioned on one or both surfaces of the photosensitive material in order to promote release of a coating material from the mold. In these embodiments, the membrane layer functions as a release film or release layer.

Figure 2:
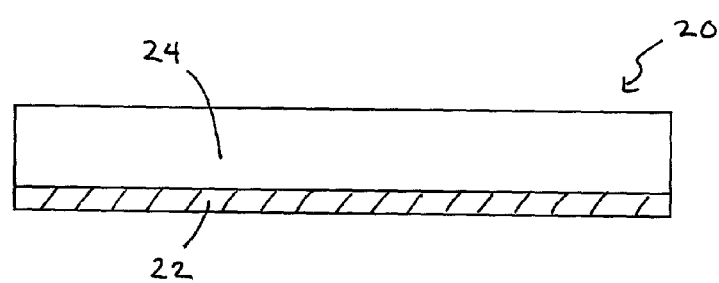
FIG. 2 is an enlarged cross-sectional view of a portion of a laminate constructed and arranged in accordance with the invention before exposure to light.
Figure 3:
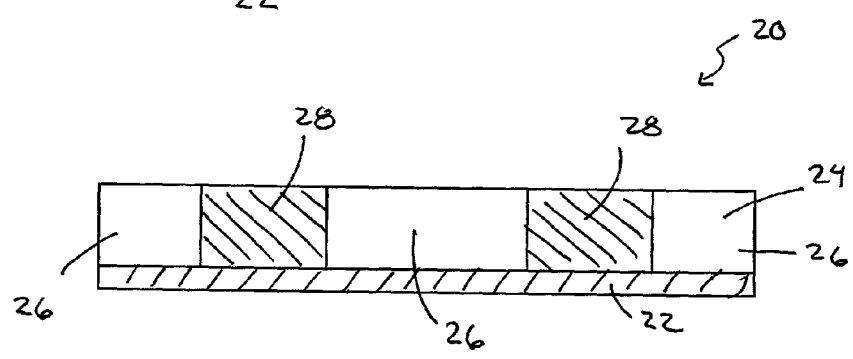
FIG. 3 is an enlarged cross-sectional view of a portion of a laminate constructed and arranged in accordance with the invention after exposure to light.
Figure 4:
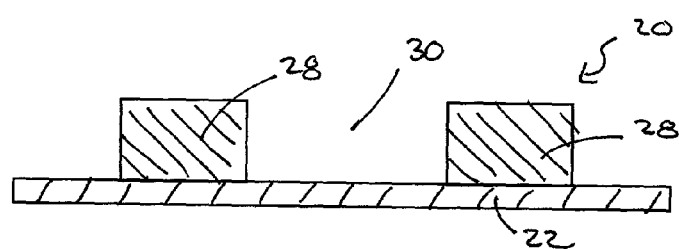
FIG. 4 is an enlarged cross-sectional view of a portion of a laminate constructed and arranged in accordance with the invention after exposure to light and development to remove unexposed photosensitive material.

Now, in reference to the figures, FIG. 1 shows an embodiment of the photosensitive laminate structure 10 of the invention using a negative-working photosensitive material. In laminate 10, a support or carrier layer comprising typically a polyester film 12 is shown. Coated on film 12 is a first photosensitive layer 14. FIG. 2 shows a two-layer laminate 20 of the invention comprising a carrier layer 22 and a photosensitive layer 24. FIG. 3 shows the laminate 20 after exposure to light, but before developing. In FIG. 3 a portion of photosensitive layer 24 has been crosslinked or polymerized (for example) in two points to form areas 28 that have been exposed to light and areas 26 that have not been exposed to light sufficient to crosslink or polymerize the photosensitive layer. FIG. 4 shows the laminate 20 after developing, in which case most of the photosensitive layer that has not been exposed to light is removed, while the crosslinked or polymerized portions 28 remain, forming a mold area 30 that has the two protruding polymerized portions 28.

Figure 5:
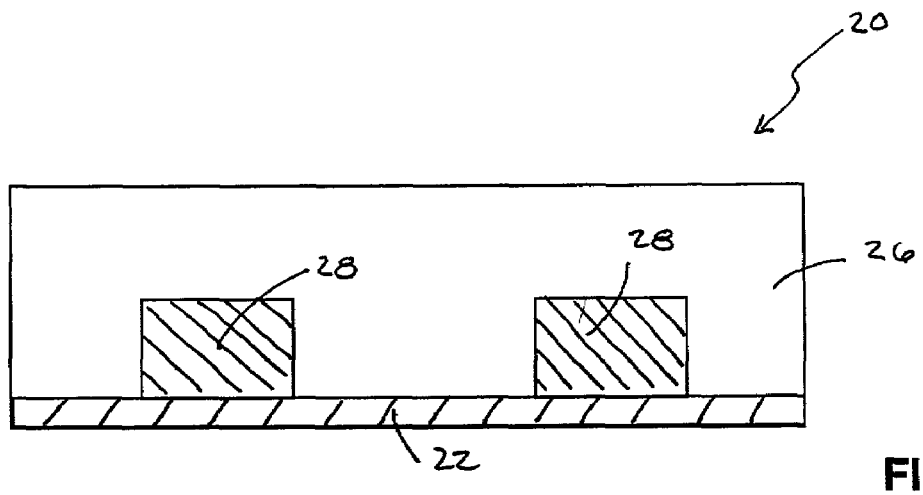
FIG. 5 is an enlarged cross-sectional view of the laminate of FIG. 4 after an additional layer of photosensitive material has been added.
Figure 6:
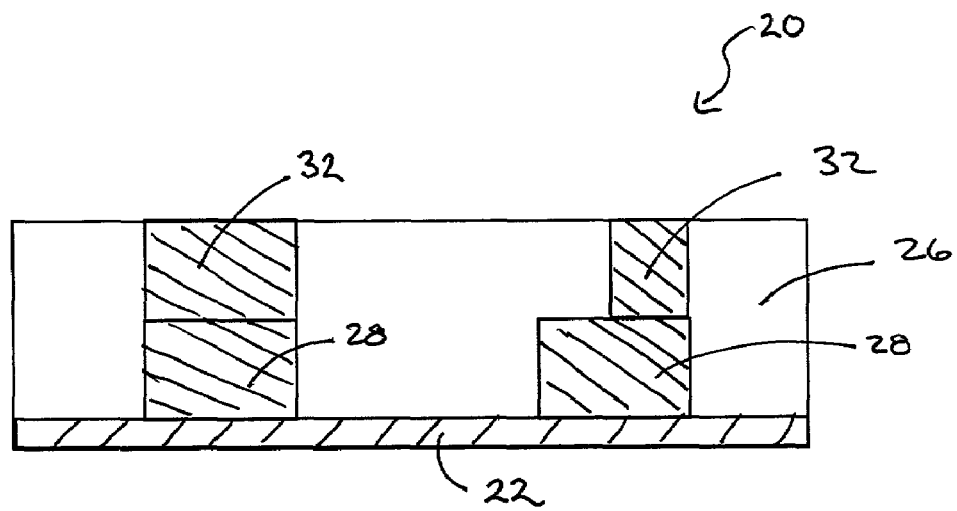
FIG. 6 is an enlarged cross-sectional view of the laminate of FIG. 5 after the additional layer of photosensitive material has been exposed to light.
Figure 7:
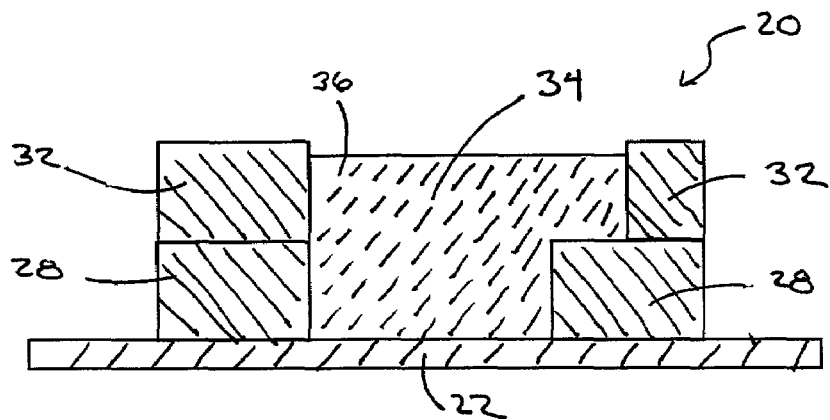
FIG. 7 is an enlarged cross-sectional view of the laminate of FIG. 6 after the additional layer of photosensitive material has been developed and a casting material poured into the mold formed by the photosensitive material.
Figure 8:
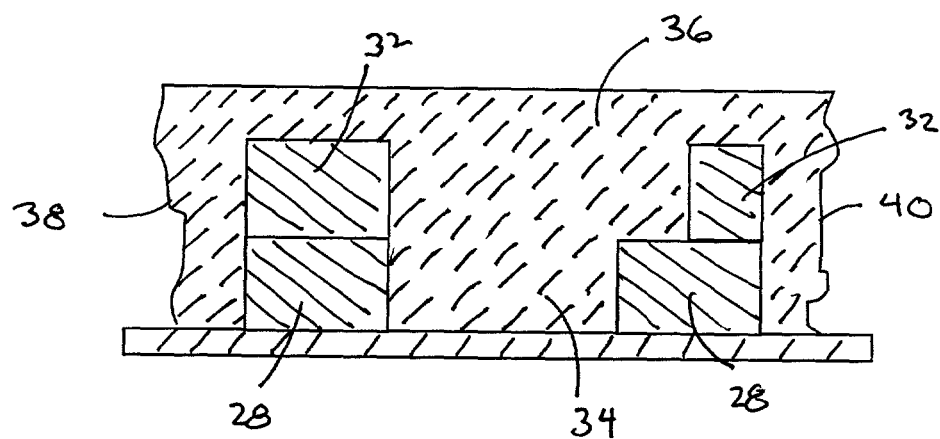
FIG. 8 is an enlarged cross-sectional view of the laminate of FIG. 6 after the additional layer of photosensitive material has been developed and a casting material poured into the mold formed by the photosensitive material in an alternative arrangement from that in FIG. 7.
Figure 9:
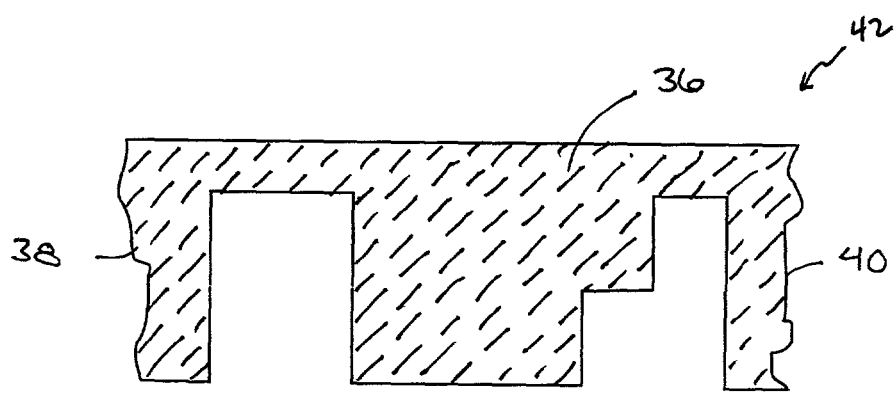
FIG. 9 is a partial cross-sectional view of a molded object from FIG. 8 after removal from the mold.

FIGS. 5, 6, and 7 show a further embodiment of the invention in which additional layers are formed on top of the developed laminate of FIG. 4. In FIG. 5 additional photosensitive material 26 is added, and then in FIG. 6 portions 32 of this material 26 are exposed to light sufficient to polymerize it. In FIG. 7 the excess non-crosslinked or polymerized photosensitive material has been removed to form mold 34 into which casting material 36 has been added. In an alternative implementation shown in FIG. 8, the casting material 36 is applied so that it covers all or most of the polymerized photosensitive material 28, 32. In some implementations the casting material can be significantly thicker than the amount of relief in the mold. Thus, thick objects with molded surface are contemplated by the invention. FIG. 8 shows only a partial representation of the casting material 36, with edges 38, 40 continuing but not shown. In FIG. 9 the casting material 36 of FIG. 8 has been removed to show a finished molded article 42.

Prior to photoimaging and developing, the photosensitive layer of the laminate exhibits cohesion sufficient to maintain dimensional stability. After photoimaging and developing, the photosensitive layer of the photosensitive laminate exhibits sufficient ductility and flexibility to withstand physical handling. To achieve these goals, the photosensitive laminate preferably comprises a photosensitive component, a binding resin, and a plasticizer.

Methods of Forming and Using Mold

The radiation can be directed into the photosensitive layer in an imagewise manner to form selectively insoluble regions for imaging purposes. Alternatively the radiation can be directed point wise, such as by a moving light emitting diode or a laser beam.

Any customary light source can be used for exposure of the photosensitive composition so long as it emits light having a wavelength at which the photosensitive resin can crosslink. Examples include an ultra-high-pressure mercury lamp, a high-pressure mercury lamp, a xenon lamp, a metal halide lamp, and a fluorescent lamp. Any customary exposure method can be employed such as a magnification- or reduction-projection exposure method, a contact exposure method, or a proximity exposure method. The photosensitive laminates can be developed in an aqueous solution, including a solution containing an acid, an alkali, a pH-adjusting agent, a surfactant and other ingredients. Examples of the development methods include spray-development, dipping-development, paddle-development, etc.

In certain embodiments the invention also includes a method for forming a cast article from a photosensitive laminate film.

Articles Manufacted Using Photosensitive Laminate Mold

The present invention is well suited for the production of a wide variety of molded objects. In particular the invention is well suited to manufacture of thin molded objects, but the invention can also be used to make thicker molded objects by using multiple layers of polymeric laminate stacked together. Alternatively the polymeric laminate can be used to line another container, and as such can provide for the formation of thicker molded objects.

Although the invention is not limited to the manufacture of specific molded objects, it is suitable in certain embodiments for manufacture of such objects as: Personalized materials, including molded name tags and cards, signs and advertisements, jewelry, manufacturing prototypes, textured surfaces (such as faux leather or raised wood grain), mechanical components and various articles such as letter press plates, flexographic plates, intaglio plates, rubber stamps, and printing plates made of low-melting temperature alloys.

While the invention is well suited for making molded objects in commercial and industrial applications, it is also suitable for use in very small scale applications, such as by studio artists and individuals. Anyone able to selectively expose portions of the photosensitive laminate, such as by using a mask and readily available light source, and also able to develop the laminate, can potentially use it to make molded objects. Thus, artists, students, and hobbyists can all use the materials and methods of the invention to make customized molded objects.

The invention is particularly well suited to formation of flexographic printing plates, in particular for forming molds to create flexographic printing plates. Unlike traditional methods of forming flexographic printing plates, the present invention reduces the use of organic solvents and also allows for more rapid production of printing plates using a less labor intensive and less equipment intensive process. Flexographic plates can be formed directly by casting a flexographic composition (such as a photopolymer or other reactive polymer) into a mold created using the methods and materials of the invention. The flexographic composition is subsequently cured by using, for example, UV radiation applied through one or both sides of the mold. Thus, the UV radiation is optionally applied through the mold or can be applied to the exposed flexographic composition on the top of the mold. The cured composition is readily removed from the mold and can immediately be used for printing or can be modified (such as to mount on a substrate, to further cure, to apply surface treatments, etc.) prior to use in printing. Generally the original mold can be reused for making another identical flexographic printing plate.

The present invention is well suited for use in making flexographic printing plates because it avoids various problems associated with present flexographic plate manufacturing methods, including the time associated with removing excess solvent from the plates after washing and the time associated with allowing the plates to dry (these steps are either significantly reduced or eliminated using the present invention), the need to recycle or dispose of the solvent and uncured composition, and the general need to go through two curing steps of the flexographic plate.

The foregoing description, examples, methods of use and other disclosures in the specification provide a basis for understanding the laminate materials and the operation of the invention. However, since many embodiments of the invention can be made without departing from the spirit or scope of the invention, the invention resides in the claims hereinafter appended.

We claim:

1. A method for forming a cast article, the method comprising:
    providing a photosensitive film, the film comprising at least one layer containing a photosensitive material;
    selectively exposing at least a portion of the photosensitive material of the film;

removing a portion of the layer containing the photosensitive material, the removed portion corresponding to either the exposed or unexposed portion of the photosensitive material, to form a relief surface in the film; and applying a casting material to the relief surface after formation of the relief surface to form a cast article;

wherein the photosensitive layer comprises less than 75% by weight of a water soluble, photosensitive vinyl polymer having pendent hydroxyl groups and being capable of photo-generated insolubility and less than 75 weight percent of a polymeric film-forming binder.

2. The method of claim 1, wherein the photosensitive material is developable with aqueous media.

3. The method of claim 1, wherein the photosensitive material comprises a photopolymer.

4. The method of clam 3, wherein the photopolymer has pendant, photo-crosslinkable, styryl groups.

5. The method of claim 1, wherein the photosensitive material comprises a photoinitiator and a monomer, an oligomer, or a combination of monomer and oligomer.

6. The method of claim 5, wherein the photosensitive material comprises an ethylenically unsaturated material.

7. The method of claim 5, wherein the photosensitive material comprises an acrylate material.

8. The method of claim 1, wherein the photosensitive material comprises a water-soluble, photosensitive vinyl polymer.

9. The method of claim 8, wherein the water soluble, photosensitive vinyl polymer comprises a polyvinyl alcohol polymer.

10. The method of claim 1, wherein the photosensitive material comprises less than 50 weight percent of a photopolymer, about 30 to 90 weight percent of a binder resin, and about 0 to 40 weight percent of a compatible plasticizers.

11. The method of claim 10, wherein the photosensitive material comprises about 15 to 50 weight percent of a photopolymer having pendant, photo-crosslinkable, styryl groups, about 50 to 80 weight percent of a binder resin, and about 0 to 15 weight percent of a compatible plasticizer.

12. The method of claim 1, wherein the first layer further comprises a plasticizer.

13. The method of claim 1, wherein the laminate further comprises a support layer.

14. The method of claim 1 wherein the first layer of the laminate is from 1 to 100 mils thick.

15. The method of claim 1, wherein the photosensitive laminate film is flexible.

16. The method of claim 1, wherein the casting material is selected from the group consisting of plaster, polymeric resins, uv-curable materials, and low-melting point metals.

17. The method of claim 1, wherein the casting material is used to form a flexographic printing plate.

* * * * *